United States Patent [19]

Hertlein

[11] Patent Number: 4,618,233

[45] Date of Patent: Oct. 21, 1986

[54] SCANNING WEDGE METHOD FOR DETERMINING CHARACTERISTICS OF A PHOTORESIST

[75] Inventor: Walter G. Hertlein, Jona, Switzerland

[73] Assignee: Shipley Company Inc., Newton, Mass.

[21] Appl. No.: 736,431

[22] Filed: May 20, 1985

[51] Int. Cl.[4] .............................................. G03B 41/00
[52] U.S. Cl. ..................................................... 354/20
[58] Field of Search ...................... 430/56, 331, 935; 354/20; 350/314

[56] References Cited

U.S. PATENT DOCUMENTS 3,631,772  1/1972  Curran .................................. 354/20

Primary Examiner—Donald A. Griffin
Attorney, Agent, or Firm—Robert L. Goldberg

[57] ABSTRACT

A method and a system for determining the characteristics of a photoresist are disclosed. This scanning wedge method is accomplished by linearly varying the exposure dose the photoresist receives. Thereafter, the photoresist is developed. The location of interference fringes on the developed photoresist is then determined. This provides the data necessary to determine the characteristics of the photoresist.

10 Claims, 10 Drawing Figures

— FULL EXPOSURE DOSE
REGION OF COMPLETE RESIST REMOVAL

INTERFERENCE FRINGES DUE TO
THE RESIST THICKNESS TAPER

— NO EXPOSURE 04-27-1985
PHOTORESIST: S1400-31 LOT #210684-527
SOFT BAKE: 90 DEGREES C FOR 30 MINUTES
RESIST THICKNESS: 1.702 MICRONS

DEVELOPER: MP-354
DEVELOPMENT TIME: 60 SECONDS
DEVELOPER MAKE UP: 100%
DEVELOPMENT TEMPERATURE: 21C

EXPOSURE INTENSITY = 2.80 MW/SQ CM
EXPOSURE TRAVERSE TIME = 14.6 SECONDS

SCANNING WEDGE METHOD FOR DETERMINING CHARACTERISTICS OF A PHOTORESIST

BACKGROUND OF THE INVENTION

This invention relates to a method and apparatus for rapidly characterizing photoresists which is fast, efficient and accurate.

Photoresists comprise coatings produced from solution or applied as a dry film which, when exposed to light of the proper wavelength, are chemically altered in their solubility to certain solvents (developers). Two types are used, negative acting resists and positive acting resists. A positive resist is insoluble in its developer until after exposure to light, while negative resists work the opposite way. Both resists define an image as a result of exposure to light.

Photoresists, particularly positive photoresists, have become very useful in the manufacture of printed circuits and semiconductors. The image quality depends on the optical transfer means (optical contrast) and the photoresist/developer system (chemical contrast). Photoresist material, however, can vary substantially in photoresponse and resolution capabilities depending on its age, source, and other factors. This can affect the quality of the photoresist image obtained, thereby affecting the quality of the product. It is consequently important for a manufacturer to know characteristic parameters for each batch of photoresist used.

One method used to determine response characteristics is by using characteristic curves. The standard way of drawing a characteristic curve is as a plot of resist thickness remaining versus log exposure. Using such a curve one can determine photospeed and contrast for different photoresist/developer systems with relative ease. Accordingly, the ease and accuracy with which such characteristic curves can be plotted is very important.

Characteristic curves have been plotted using step index exposures (small areas exposed with variable exposure energies on same substrate in wafer stepper) or step index type masks. These masks are placed over the photoresist and the system is then exposed to light. See U.S. Pat. No. 3,631,772 of Curran et al. However, such masks only give a discrete number of points that can be plotted on the characteristic curve. Additionally, there is no assurance for a given mask that the most pertinent points will be obtained by the series of steps used. Therefore, a certain amount of trail and error testing using various masks may be necessary before a relevant characteristic curve can be obtained.

The method disclosed herein significantly simplifies the analysis procedure for photoresist material. This method also provides a more precise characteristic curve and consequently more accurate indication of a photoresist's photospeed and contrast.

BRIEF DESCRIPTION OF THE DRAWINGS

FIG. 1 is a drawing of an exposure apparatus that can be used in the present method to linearly vary the exposure dose that the photoresist receives.

DESCRIPTION OF THE INVENTION

It has now been found that a simple and accurate method of determining the photospeed and contrast of a photoresist/developer system can be performed by linearly varying the exposure dose that a photoresist receives. This technique of linearly varying the exposure dose that the photoresist receives is described herein as the scanning wedge method.

Figure 1A:
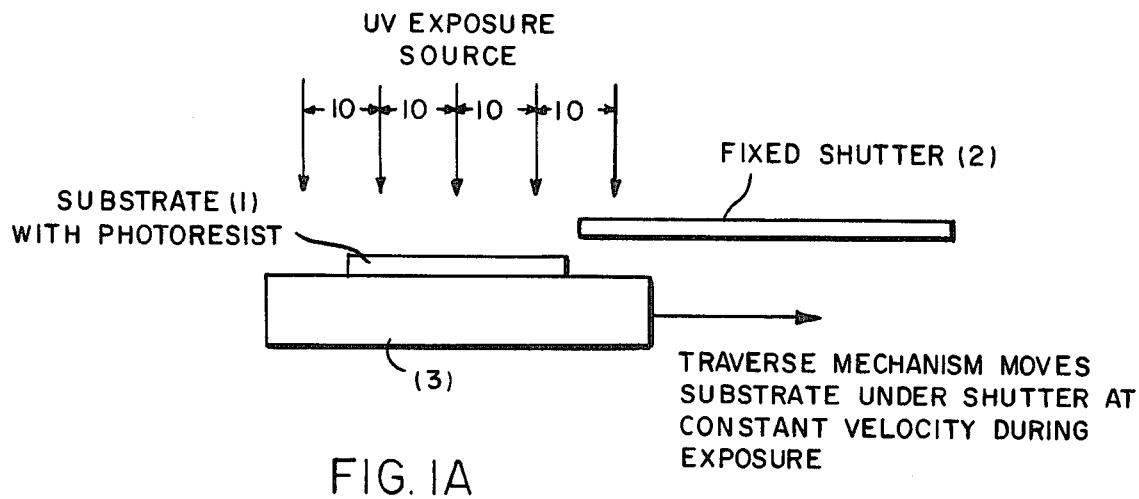
FIG. 1A shows the configuration of the apparatus at the beginning of exposure and FIG. 1B shows the configuration at the end of exposure.
Figure 1B:
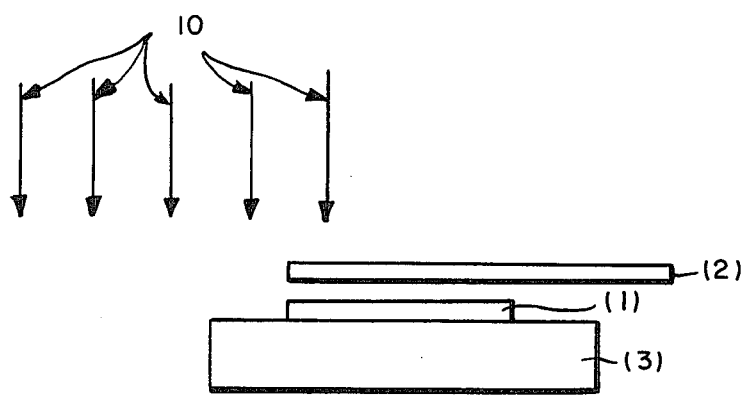

Linearly varying the exposure dose that the photoresist receives may be accomplished in a variety of different ways. For example, as illustrated in FIG. 1, a substrate containing the photoreisist (1) can be moved under a fixed shutter (2) at a constant rate during exposure. The substrate with the photoresist may be moved by placing the substrate on a traverse mechanism (3). Thus, the exposure dose (10) received by the photoresist will vary linearly as the photoresist is moved under the fixed shutter. Alternatively, the photoresist may be stationary and the shutter can be moved to block the light source.

Alternatively, a test mask can be used that goes continuously from opaque to transparent, in a linear fashion. The mask can be prepared by coating a glass substrate, typically 60-mils thick, with linearly increasing amounts of chromium. The chromium coating is of extremely fine grain size. However, other compounds well know to the person of ordinary skill in the art can be used to form the coating. This mask can then be placed over the photoresist and the photoresist exposed to a light source.

The exposed resists may then be developed by methods well known in the art, such as immersion or spraying.

Figure 2:
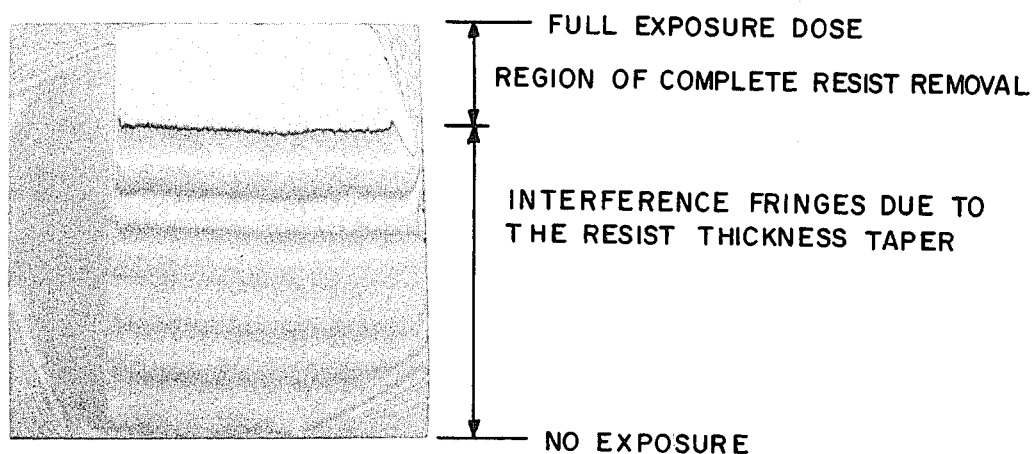
FIG. 2 is a picture of a developed positive photoresist taken from above.

Because of the varying degree of exposure that the photoresist receives, the resist thickness after development will vary. For a positive photoresist, as shown in FIG. 2, the portion receiving a full exposure dose will be clear, indicating it is a region of complete resist removal. The remaining portion of the resist has a varying thickness as differing amounts of resist are removed until the no exposure portion is reached where almost no resist is removed by developing. By protecting a small area in the unexposed area by a self-adhesive protecting tape during development, the thickness loss due to developer action can be determined under the same conditions and on the same sample. The exact opposite will occur with a negative photoresist. As a consequence of the difference in thickness, there will be, under illumination by monochromatic light or polychromatic light, a pattern on the photoresist which will coonsist of a set of black or rainbow colored parallel interference fringes, respectively. The fringes are obtained due to resist thickness variations across the plate, as illustrated in FIG. 2.

There interference fringes result because when two light waves of the same amplitude and wavelength arrive at a given point simultaneously and in phase, illumination will occur at that point. If they are out of phase, no illumination will occur because the waves annul each other. It has been found that this phenomenon can be taken advantage of in order to obtain the information necessary for plotting a characteristic curve with ease and accuracy. One measures the location of the interference fringes relative to the edge of the photoresist.

Figure 3:
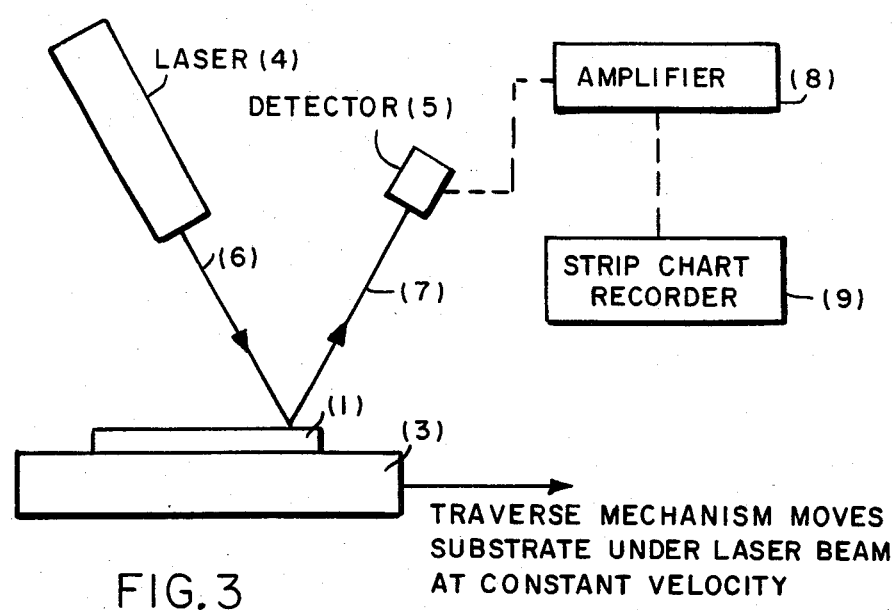
FIG. 3 is a drawing of a laser reflectivity apparatus that can be used to determine the location of interference fringes relative to the edge of the substrate.
Figure 4:
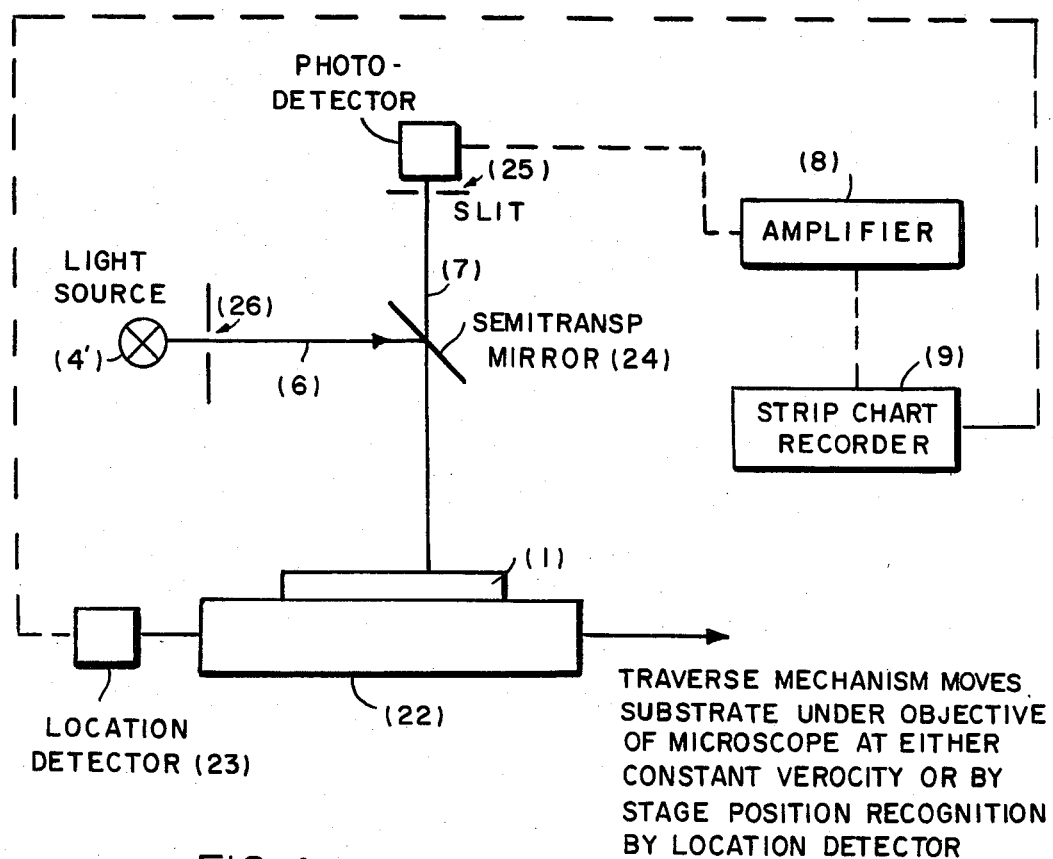
FIG. 4 is a drawing of a microscope with incident monochromatic light illumination that can be used to determine the location of interference fringes relative to the edge of the substrate.

Measurement of interference fringes can be done by any of a number of means. It can be done manually by visual inspection. More preferably, one measures the optical reflectance across the plate with a laser reflectivity apparatus as shown in FIG. 3. One uses a laser source (4) to result in a laser beam striking the photoresist on the substrate (1). The beam reflected from the photoresist (7) is read by a detector (5) as the substrate containing photoresist is scanned across the beam. Another system, as described in FIG. 4, uses a standard microscope. A monochromatic light source (4') (laser, Light Emitting Diode, monochromator (26) or line filter in light path (26)) is used for incident illumination in the microscope. A semitransparent mirror (24) reflects the light onto the photoresist on the substrate (1). The substrate is placed on the microscope stage (22). The movement of this stage is controlled by a step motor and/or a linear circular incremental step counter. The stage either moves the substrate under the microscope objective (25) at constant velocity or by stage position recognition by a location detector (23). The reflected light (7) passes through the semitransparent mirror and into the microscope objective. The eyepiece of the microscope is replaced by a photodetector (5) to measure reflectance. The reflectance noted by the detectors in either method is fed into an amplifier (8) which may then graph the reflectance on a strip chart recorder (9). Alternatively, the reflectance measured by the detector may be fed directly into a computer which can perform the necessary calculations to plot a characteristic curve.

Figure 5:
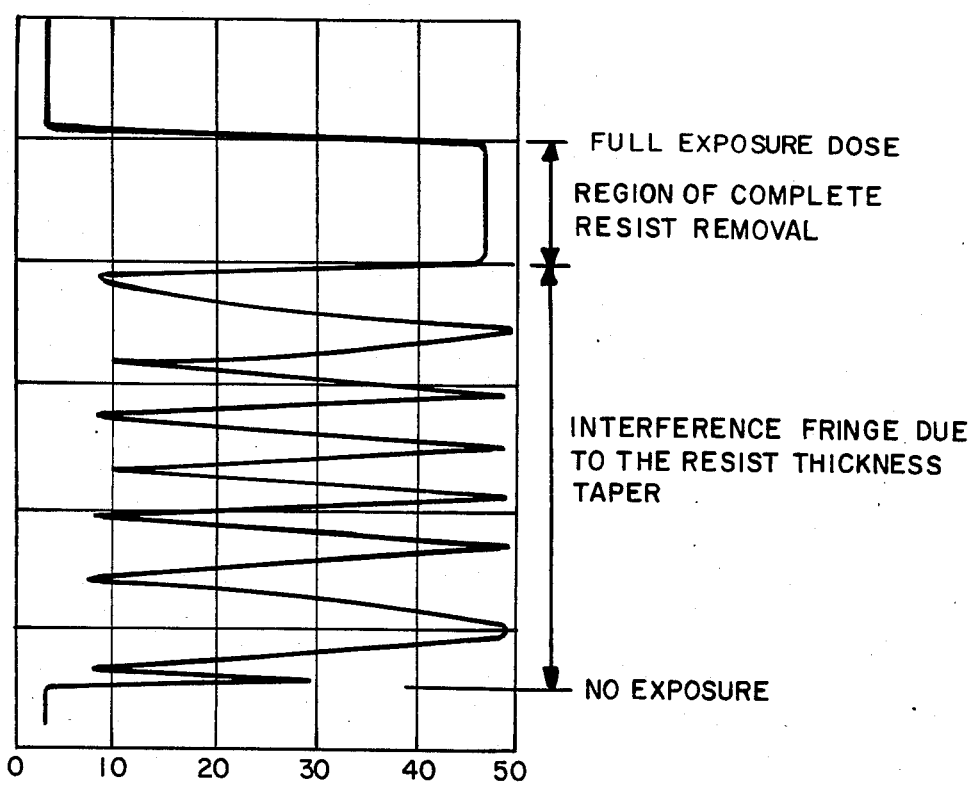
FIG. 5 is a typical strip chart record obtained by measuring the reflectivity across and exposed and developed photoresist.

A typical strip chart record obtained of the reflected intensity across a sample is shown in FIG. 5. The region of the resist where there has been complete resist removal is taken as peak 0. This is the portion of the resist receiving a sufficient exposure dose for full development. Thereafter, there are a number of peaks and minimums that reflect interference fringes due to variations in resist thickness. Finally, a minimum is reached where no exposure has been obtained.

The distance of each fringe on the photoresist, along with the exposure intensity in the traverse time during exposure, provide the information necessary to plot a characteristic curve. One can use this strip chart data and measure the chart units from the high exposure end of the plate to each peak and to the low exposure end of the photoresist. Thereafter, the exposure dose corresponding to each peak can be calculated by using the formula:

$$D_i = I\, T(1 - C_i/C_r),$$

wherein D is the dose at peak i; I is the exposure intensity, T is the total traverse time; $C_i$ is the number of chart units to peak i; and $C_r$ is the total number of chart units to the end of the plate.

The resist thickness at each peak may be calculated by starting at peak 0 with 0 thickness and adding a specific number of angstroms, Q, for each half cycle in the interference pattern. This number is obtained by using the formula:

$$Q = \frac{\lambda}{n\,(2)(2)\cos(\theta)}, \lambda$$

wherein $\lambda$ is the wavelenght of the laser or the monochromatic light source, n is the refractive index of the film, and is the angle of the laser beam in the film relative to the normal. When the microscope is used the incident light cos $(\theta) = 1$. One factor of 2 in the denominator is required to give the thickness difference corresponding to a half cycle rather than a full cycle whereas the other factor of 2 is used because one of the interfering rays travels through the photoresist film twice.

Figure 6:
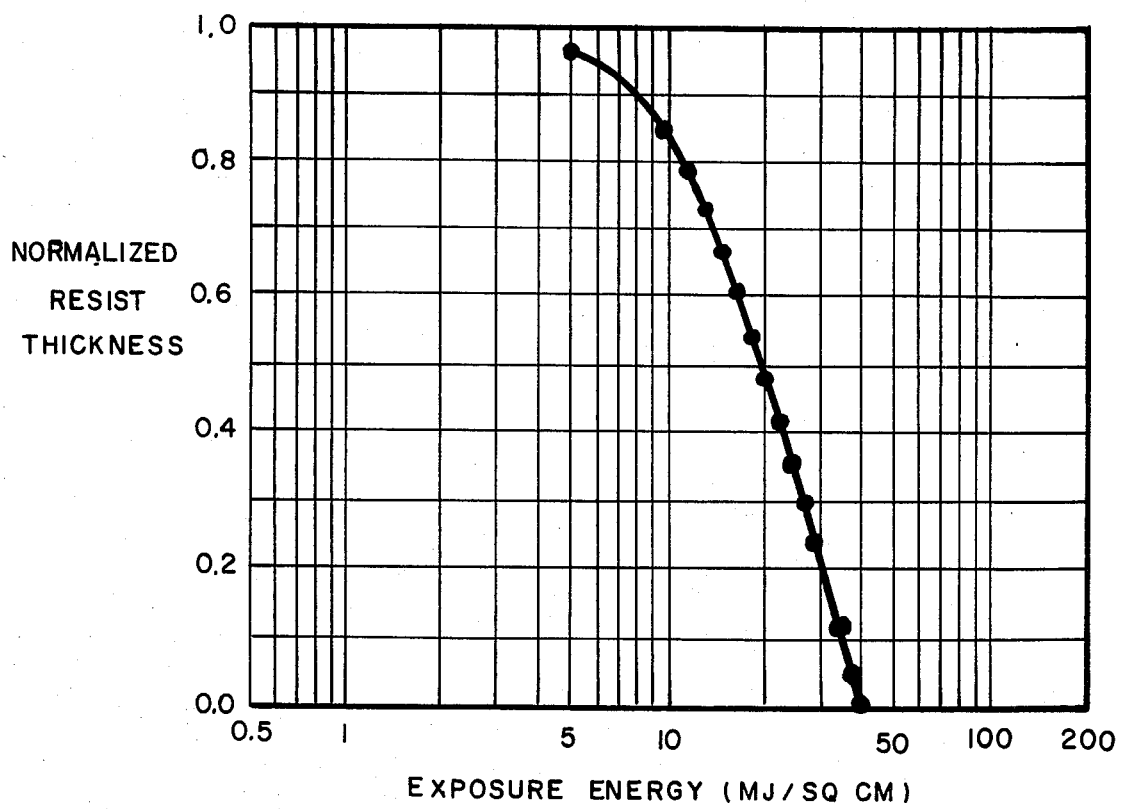
FIG. 6 is a typical characteristic curve showing exposure energy (mj/sq cm) vs. normalized resist thickness.

Thereafter, one can plot normalized resist thickness versus log exposure doses. For a positive photoresist, the photospeed is calculated based upon the minimum energy required to clear the photoresist. The exact opposite concept would be used with a negative photoresist. The contrast of the resist is the absolute value of the slope of the characteristic curve, gamma. A typical characteristic curve obtained is shown in FIG. 6. The exposure intensity was 5.00 mw/sq cm with an exposure traverse time of 8.5 seconds.

Figure 7:
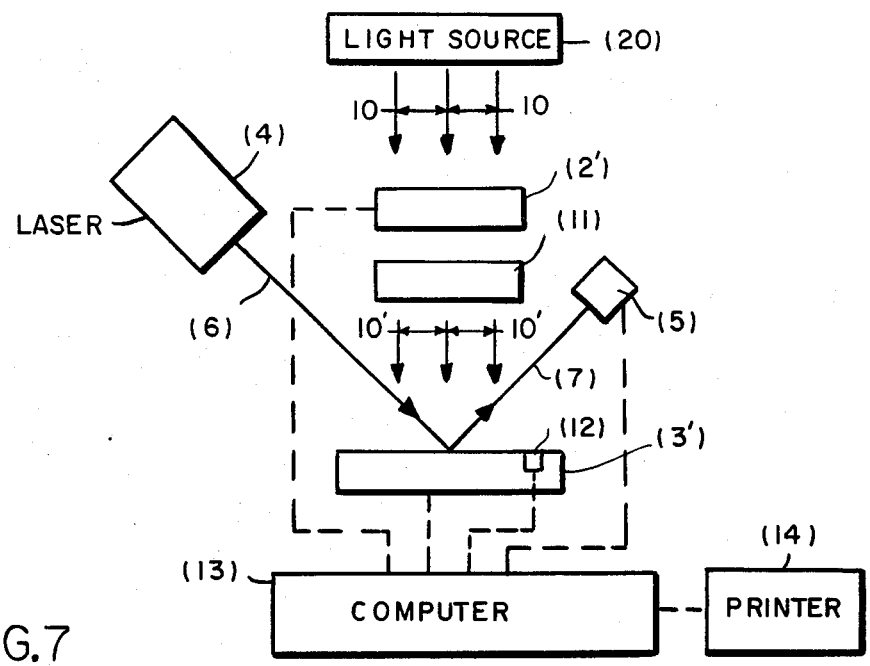
FIG. 7 is a drawing of a fully automated system that can be used to determine characteristics of a photoresist by the present method.

This method could be carried out by a fully automated system as illustrated in FIG. 7 to further increase its ease and efficiency. A light source (20) is used to illuminate (10) a photoresist. A moveable shutter (2') is connected to a computer (13). The computer will move the shutter under the light source at a fixed time. A filter holder containing a filter (11) which can be used to vary the light source (10') actually striking the substrate containing the photoresist is placed under the shutter. The substrate containing the photoresist is placed on a platform (3') which can be stationary. Alternatively, the platform (3') can be a traverse mechanism driven by a motor (12) to move the substrate linearly across the light source as the shutter is held constant. A laser source (4) is used to determine the reflectance of the photoresist after it is developed. A laser beam (6) strikes the photoresist and is reflected from the resist (7) into a detector for monitoring the laser reflectance (5) as the photoresist on substrate is moved across the laser beam by using a traverse mechanism driven by a motor (12). The computer (13) records the data from the detector (5). A fully plotted characteristic curve can be printed directly at a printer (14). The computer can also directly feed out the photospeed and contrast of the photoresist without printing a characteristic curve if that is desired.

Monochromatic light having a wavelength corresponding to an absorption maximum of the photoresist can be used in one embodiment. The measured optical density will then be directly related to the developed film thickness. Corresponding variation of the optical density versus log exposure data for the photoresist can be derived as discussed above. The optical density versus log exposure curve obtained reflects in its slope the photosensitivity of the photoresist material and, in the height of its plateau, the polymer content of the specific batch of photoresist.

The scanning method disclosed herein can be used to obtain the characteristics of a photoresist in a matter of 5 minutes. This contrasts dramatically with previous methods used to calculate characteristics of a photoresist, such as the step index mask method or step index exposure method. Additionally, because the entire photoresist is continually exposed and data is obtained based upon this continuous exposure, the points plotted on the characteristic curve will include all relevant points. When a step index type method is utilized it is possible that for a new batch of photoresists the points obtained at a particular "step" are not the most relevant points, i.e., they will not indicate changes in the actual slope of the curve. Consequently, the characteristic curve obtained will not be as precise as that obtained by the scanning wedge technique. The scanning wedge system can be more readily and effectively adapted to obtaining characteristics for a variety of photoresists and/or developers, including resists of unknown characteristics than the step index technique. Additionally, because the characteristic curve obtained by the scanning wedge method is more precise, the characteristic data based on this characteristic curve will be more accurate.

The following example using a positive photoresist will better serve to illustrate the invention.

A substrate consisting of a 2" by 2" glass plate with 1000 angstroms of evaporated chromium is spin coated with a photoresist (Shipley photoresist S1400-31) using a spin-coater (Headway). The photoresist on the substrate is then dried at 90° C. for 30 minutes in a forced air convection oven (Blue M). The photoresist is then exposed to a 200 watt mercury arc light source (Oriel) and moved underneath a shutter by use of a traverse mechanism. The exposure intensity is 2.8 mw/cm² as measured by a radiometer (International Light) with a light detector (SC140B). The substrate containing the photoresist is moved underneath the mercury arc light source at a scan rate of 8.22'/minute.

Figure 8:
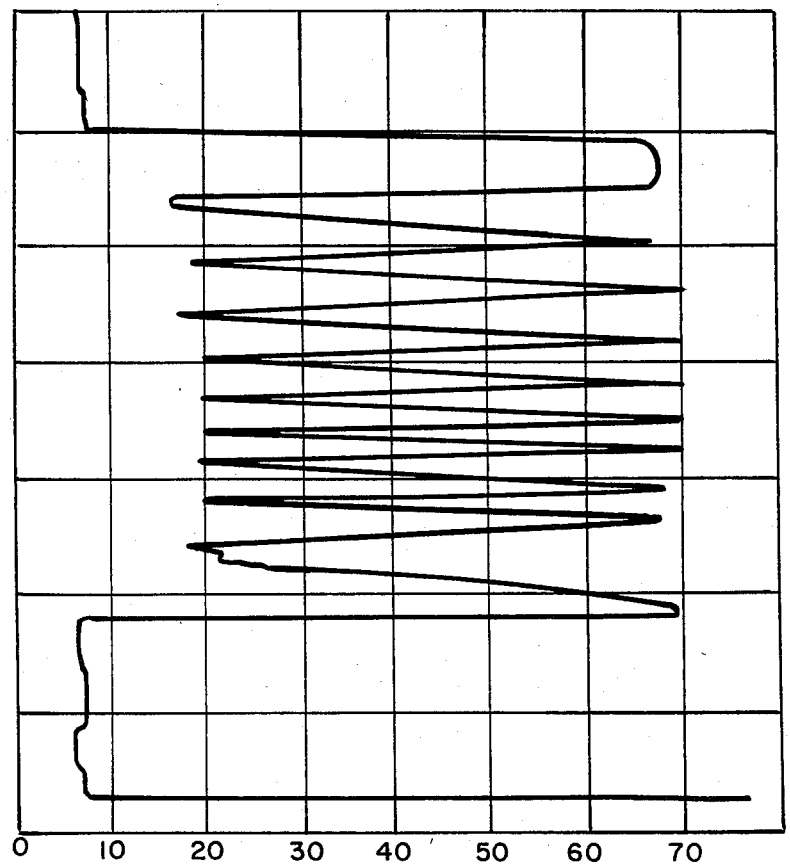
FIG. 8 is a strip chart record obtained for an exposure intensity of 2.80 mw/sq cm with an exposure traverse time of 14.6 seconds.

The exposed photoresist is developed by immersion for one minute into a developer (MP-354) at 21° C. Thereafter, the reflectivity across the photoresist is recorded by using a 0.5 mw He-Ne laser manufactured by Spectra Physics. The substrate is placed on a scanning stage which enables the laser beam to scan the substrate. The reflected light is measured by a light detector which is attached to an amplifier and chart recorder. The chart obtained is shown in FIG. 8.

For this data one is able to measure both the chart units from the high exposure end of the substrate to each peak and the low exposure end of the substrate. One is then able to calculate the exposure dose corresponding to each peak by using the formula:

$$D_i = I\,T(1 - C_i/C_r)$$

to obtain the exposure dose in mj/sq. cm for each peak. Thereafter, from this data the log exposure dose can be derived. The resist thickness at each peak is calculated by adding a fixed number of angstroms, Q, for each half cycle in the interference pattern.

$$Q = \frac{\lambda}{n\,(2)(2)\cos(\theta)}$$

In the example described herein Q is equal to 986 angstroms for each half cycle. The data obtained is set forth in the table below.

| PEAK # | CHART READING | FRACTION OF TOT. | DOSE MJ/SQ CM | LN DOSE | RESIST THKNESS | NORM. THKNESS |
|---|---|---|---|---|---|---|
| 0 | 1.40 | 0.112 | 36.30 | 3.592 | 0.000 | 0.000 |
| 1 | 1.80 | 0.144 | 34.99 | 3.555 | 0.099 | 0.058 |
| 2 | 2.70 | 0.216 | 32.05 | 3.467 | 0.197 | 0.116 |
| 3 | 3.40 | 0.272 | 29.76 | 3.393 | 0.296 | 0.174 |
| 4 | 4.10 | 0.328 | 27.47 | 3.313 | 0.394 | 0.232 |
| 5 | 4.70 | 0.376 | 25.51 | 3.239 | 0.493 | 0.290 |
| 6 | 5.35 | 0.428 | 23.38 | 3.152 | 0.592 | 0.348 |
| 7 | 5.90 | 0.472 | 21.58 | 3.072 | 0.690 | 0.406 |
| 8 | 6.45 | 0.516 | 19.79 | 2.985 | 0.789 | 0.463 |
| 9 | 6.90 | 0.552 | 18.31 | 2.908 | 0.887 | 0.521 |
| 10 | 7.30 | 0.584 | 17.01 | 2.834 | 0.986 | 0.579 |
| 11 | 7.80 | 0.624 | 15.37 | 2.732 | 1.085 | 0.637 |
| 12 | 8.20 | 0.656 | 14.06 | 2.644 | 1.183 | 0.695 |
| 13 | 8.55 | 0.684 | 12.92 | 2.559 | 1.282 | 0.753 |
| 14 | 9.00 | 0.720 | 11.45 | 2.438 | 1.380 | 0.811 |
| 15 | 9.40 | 0.752 | 10.14 | 2.316 | 1.479 | 0.869 |
| 16 | 9.90 | 0.792 | 8.50 | 2.140 | 1.578 | 0.927 |
| 17 | 10.70 | 0.856 | 5.89 | 1.773 | 1.676 | 0.985 |
| EOP | 12.50 | | | | | |

Figure 9:
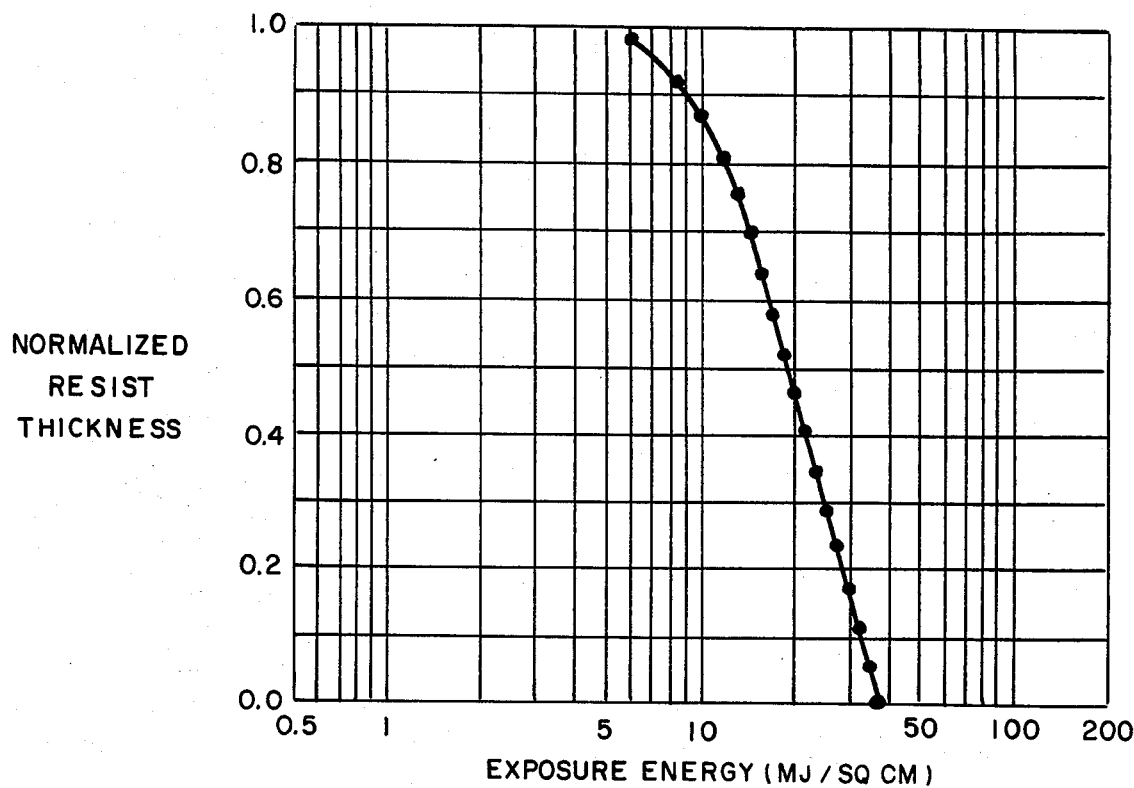
FIG. 9 is the characteristic curve obtained from the data in the strip chart record of FIG. 8.

Thereafter, one plots the characteristic curve based on normalized resist thickness versus log exosure dose (see FIG. 9). The minimum energy required to clear the film is 36.3 mj/sq. cm. The contrast of the resist as determined by the absolute value of the slope of the characteristic curve, gamma is 1.65.

It is to be understood that the embodiments described herein are merely illustrative of the principles of the present invention. Modifications can be made thereto by persons with ordinary skill in the art without departing from the spirit and scope of the present invention.

I claim:

1. A method for determining the characteristics of a photoresist which comprises:
   linearly varying the exposure dose the photoresist receives;
   developing the photoresist; and
   determining the location of interference fringes that appear on the developed photoresist relative to the edge of the photoresist.

2. The method of claim 1 wherein the exposure of the photoresist is linearly varied by having a fixed exposure source, a fixed shutter and a means for moving the photoresist under the shutter at a constant velocity during exposure.

3. The method of claim 2 wherein the movement of the photoresist is controlled by a computer.

4. The method of claim 1 wherein the exposure of the photoresist is linearly varied by having a shutter moved under a light source and over a photoresist at constant velocity during exposure.

5. The method of claim 1 wherein the exposure of the photoresist is linearly varied by using a test mask that continuously goes from opaque to transparent.

6. The method of claim 1 wherein the location of the interference fringes is determined by measuring the optical reflectance across the photoresist.

7. The method of claim 6 wherein the optical reflectance is determined by reflecting a laser beam from the photoresist into a detector while the photoresist is scanned across the laser beam.

8. A photoresist test mask comprising:
an optically transparent substrate; and
a coating of a granular matter on the top surface of the substrate that linearly varies from no coating to an opaque coating.

9. A system for determining the photospeed and contrast of a photoresist comprising a platform on which the photoresist is placed, means to subject the photoresist on the platform to an exposure source, means for linearly moving the platform under a shutter placed between the platform and the exposure source to provide the photoresist with a linearly varying exposure dose, and means for determining the location of interference fringes on a developed photoresist.

10. The system of claim 9, wherein the interference fringes are determined by directing a laser beam at the developed photoresist, having a means to continuously move the photoresist underneath the laser beam, having a detector located to receive reflectance of the laser beam from the photoresist, and having a means to record the reflectance as measured by the detector.

* * * * *